United States Patent
Liu et al.

(10) Patent No.: US 9,755,820 B2
(45) Date of Patent: Sep. 5, 2017

(54) FREQUENCY OFFSET DETECTION METHOD AND APPARATUS

(71) Applicant: HUAWEI TECHNOLOGIES CO., LTD., Shenzhen (CN)

(72) Inventors: Wang Liu, Shenzhen (CN); Yongliang Liu, Chengdu (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 15/084,031

(22) Filed: Mar. 29, 2016

(65) Prior Publication Data

US 2016/0211969 A1    Jul. 21, 2016

Related U.S. Application Data

(63) Continuation of application No. PCT/CN2014/086674, filed on Sep. 17, 2014.

(30) Foreign Application Priority Data

Sep. 30, 2013   (CN) .......................... 2013 1 0465515

(51) Int. Cl.
*H04L 7/00*     (2006.01)
*H04L 7/04*     (2006.01)
(Continued)

(52) U.S. Cl.
CPC ............ *H04L 7/042* (2013.01); *H03L 7/07* (2013.01); *H04J 3/0691* (2013.01); *H04L 7/0037* (2013.01)

(58) Field of Classification Search
CPC ...... H04L 7/0337; H04L 7/0334; H03L 7/091
(Continued)

(56) References Cited

U.S. PATENT DOCUMENTS 5,875,388 A      2/1999  Daughtry, Jr. et al.
5,898,903 A  *   4/1999  Hu ........................... H04B 7/01
                                                         455/20
(Continued)

FOREIGN PATENT DOCUMENTS

CN      1457570          11/2003
CN      1578197 A    *    2/2005
(Continued)

OTHER PUBLICATIONS

International Search Report mailed Dec. 31, 2014 in corresponding International Application PCT/CN2014/086674.
(Continued)

*Primary Examiner* — Khai Tran
(74) *Attorney, Agent, or Firm* — Staas & Halsey LLP

(57) ABSTRACT

Embodiments of the present invention provide a frequency offset detection method and apparatus. The frequency offset detection method in the present invention includes: calibrating a frequency offset of a clock signal output by a local crystal oscillator of a network element device, and performing frequency offset detection on a tracked reference clock signal by using the calibrated clock signal output by the local crystal oscillator. The embodiments of the present invention solve a problem in the prior art that a detection result for a frequency offset of a reference clock signal is inaccurate because of an existence of a frequency offset of a local crystal oscillator and a parameter drift caused by aging, thereby improving detection precision without replacing hardware.

16 Claims, 4 Drawing Sheets

Calibrate a frequency offset of a clock signal output by a local crystal oscillator of a network element device — 110

Perform frequency offset detection on a tracked reference clock signal by using the calibrated clock signal output by the local crystal oscillator — 120

(51) Int. Cl.
*H04J 3/06* (2006.01)
*H03L 7/07* (2006.01)

(58) Field of Classification Search
USPC ........ 375/355, 260, 345, 356, 376; 327/155; 455/20, 69
See application file for complete search history.

(56) References Cited

U.S. PATENT DOCUMENTS

| | | | |
|---|---|---|---|
| 5,943,606 A | 8/1999 | Kremm et al. | |
| 8,427,219 B1* | 4/2013 | Wu | G06F 1/04 327/154 |
| 2010/0182056 A1* | 7/2010 | Liang | H03L 7/00 327/155 |

FOREIGN PATENT DOCUMENTS

| | | | |
|---|---|---|---|
| CN | 1578197 A | | 2/2005 |
| CN | 102566410 A | * | 7/2012 |
| CN | 102566410 A | | 7/2012 |
| CN | 102833026 A | | 12/2012 |
| EP | 1160981 | | 12/2001 |
| JP | 2011-109516 | | 6/2011 |

OTHER PUBLICATIONS

Chinese Office Action dated Dec. 2, 2016 in Chinese Patent Application No. 201310465515.4.
International Search Report dated Dec. 31, 2014 in corresponding International Patent Application No. PCT/CN2014/086674.
Extended European Search Report dated Jun. 14, 2016 in corresponding European Patent Application No. 14847912.4.
"Series G: Transmission Systems and Media,Digital Systems and Networks Digital transmission systems—Digital networks—Design objectives for digital networks Timing characteristics of primary reference clocks", ITU-T Recommendation G.811, Telecommunication Standardization Sector of ITU, International Telecommunication Union, Sep. 1997, 11 pages.
"Series G: Transmission Systems and Media,Digital Systems and Networks Digital networks—Design objectives for digital networks Timing requirements of slave clocks suitable for use as node clocks in synchronization networks", ITU-T Recommendation G.812, Telecommunication Standardization Sector of ITU, International Telecommunication Union, Jun. 2004, 46 pages.
"Series G: Transmission Systems and Media,Digital Systems and Networks Digital networks—Design objectives for digital networks Timing characteristics of SDH equipment slave clocks (SEC) Corrigendum 1", ITU-T Recommendation G.813 (2003)—Corrigendum 1, Telecommunication Standardization Sector of ITU, International Telecommunication Union, Jun. 2005, 10 pages.

* cited by examiner

FREQUENCY OFFSET DETECTION METHOD AND APPARATUS

CROSS-REFERENCE TO RELATED APPLICATIONS

This application is a continuation of International Application No. PCT/CN2014/086674, filed on Sep. 17, 2014, which claims priority to Chinese Patent Application No. 201310465515.4, filed on Sep. 30, 2013, both of which are hereby incorporated by reference in their entireties.

TECHNICAL FIELD

Embodiments of the present invention relate to communications technologies, and in particular, to a frequency offset detection method and apparatus.

BACKGROUND

A synchronous digital hierarchy (SDH for short) network uses a hierarchical master-slave synchronization manner, that is, a primary reference clock (PRC for short) is used to control an entire network to be synchronous by using a synchronization link of a synchronization distribution network. The SDH network uses a series of hierarchical clocks, and a clock at each level is synchronous to a clock at an upper level or a clock at the same level. In the SDH network, a network element device at a current level uses, as a reference clock signal, a clock signal that is transmitted by a network element device at an upper level tracked by the network element device at the current level, and continues to transmit the reference clock signal to a network element device at a lower level of network element device. However, affected by complex factors, a frequency offset occurs in the reference clock signal in the transmission process; therefore, a network element device at each level needs to perform frequency offset detection on a reference clock signal.

In the prior art, whether a frequency offset occurs in a reference clock signal is detected in a manner of counting rising edges of the reference clock signal by using a clock signal output by a local crystal oscillator of a network element device. That is, a 19.44 MHz signal obtained by performing frequency halving on a 38.88 MHz signal output by the local crystal oscillator is used as a clock counter, periodically counting rising edges of a reference clock signal whose frequency is uniformly 8 kHz obtained by means of frequency division, and whether a frequency offset occurs in the reference clock signal is determined according to an actual count value on the counter and a preset value. However, a detection result obtained in this manner is inaccurate.

SUMMARY

Embodiments of the present invention provide a frequency offset detection method and apparatus, to solve a problem in the prior art that a detection result for a frequency offset of a reference clock signal is inaccurate because of a frequency offset of a local crystal oscillator and a parameter drift caused by aging.

According to a first aspect, an embodiment of the present invention provides a frequency offset detection method, including:

calibrating a frequency offset of a clock signal output by a local crystal oscillator of a network element device; and performing frequency offset detection on a tracked reference clock signal by using the calibrated clock signal output by the local crystal oscillator.

In a first possible implementation manner of the first aspect, the calibrating a frequency offset of a clock signal output by a local crystal oscillator of a network element device includes:

calculating an external calibration value EXT_CAL according to a first count value X on a first counter and a first reference value $X_0$, where X denotes a count value obtained, when a reference clock signal input to the local crystal oscillator through an external clock interface has no frequency offset, by the first counter by counting rising edges of the clock signal output by the local crystal oscillator, $X_0$ denotes a count value obtained, when the clock signal output by the local crystal oscillator has no frequency offset and the reference clock signal input to the local crystal oscillator through the external clock interface has no frequency offset, by the first counter by counting the rising edges of the clock signal output by the local crystal oscillator, and $$X_0 = \frac{A \times f_0}{f},$$

where A is a first preset count value, A is determined according to required precision of calibration performed on the frequency offset of the clock signal output by the local crystal oscillator, $f_0$ denotes a frequency existing when the clock signal output by the local crystal oscillator has no frequency offset, and f denotes a frequency existing when the reference clock signal input to the local crystal oscillator through the external clock interface has no frequency offset; and performing, according to EXT_CAL, external calibration on the frequency offset of the clock signal output by the local crystal oscillator.

According to the first possible implementation manner of the first aspect, in a second possible implementation manner, the calculating an external calibration value EXT_CAL according to a first count value X on a first counter and a first reference value $X_0$ includes:

resetting a second counter and the first counter, and starting the first counter and the second counter simultaneously, where the second counter counts rising edges of the reference clock signal input to the local crystal oscillator through the external clock interface;

determining whether a second count value on the second counter is greater than or equal to A;

if the second count value on the second counter is greater than or equal to A, stopping the counting of the second counter, resetting the second counter, and sending a stop signal to the first counter, so that the first counter stops counting and reads X; and calculating EXT_CAL according to X and $X_0$, where $$\text{EXT\_CAL} = \frac{X - X_0}{X_0} + \Delta f,$$

$\Delta f$ denotes a frequency offset of the reference clock signal input to the local crystal oscillator through the external clock interface.

According to the first or second possible implementation manner of the first aspect, in a third possible implementation manner, after the performing, according to EXT_CAL, external calibration on the frequency offset of the clock signal output by the local crystal oscillator, the method further includes:

calculating an internal calibration value INNER_CAL1 according to m third count values $M_{3i}$ on m third counters and a second reference value $M_0$, where $M_{3i}$ denotes a count value obtained by the $i^{th}$ third counter by counting rising edges of the clock signal, output by the local crystal oscillator, on which external calibration has been performed, $M_0$ denotes a count value obtained, when the $i^{th}$ reference clock signal has no frequency offset, by the $i^{th}$ third counter by counting the rising edges of the clock signal, output by the local crystal oscillator, on which external calibration has been performed, $M_0 = X_0 \times (1+\text{EXT\_CAL})$, m reference clock signals are clock signals extracted from received service signals by the local crystal oscillator, m is an integer greater than 2, and i is an integer greater than or equal to 1 and less than or equal to m; and performing, according to INNER_CAL1, internal calibration on a frequency offset of the clock signal, output by the local crystal oscillator, on which external calibration has been performed.

According to the third possible implementation manner of the first aspect, in a fourth possible implementation manner, the calculating an internal calibration value INNER_CAL1 according to m third count values $M_{3i}$ on m third counters and a second reference value $M_0$ includes:

resetting m fourth counters and the m third counters, and starting the m third counters and the m fourth counters simultaneously, where the m fourth counters separately count rising edges of m reference clock signals, and the m reference clock signals are clock signals extracted from received service signals by the local crystal oscillator;

determining whether a fourth count value $M_{4i}$ on the $i^{th}$ fourth counter is greater than or equal to A, where $M_{4i}$ denotes a count value obtained by the $i^{th}$ fourth counter by counting rising edges of the $i^{th}$ reference clock signal:

if the fourth count value $M_{4i}$ on the $i^{th}$ fourth counter is greater than or equal to A, stopping the counting of the $i^{th}$ fourth counter, resetting the $i^{th}$ fourth counter, and sending a stop signal to the $i^{th}$ third counter, so that the $i^{th}$ third counter stops counting and reads $M_{3i}$;

calculating $$\Delta i = \frac{M_0 - M_{3i}}{M_0}$$

according to $M_{3i}$ and $M_0$; and calculating the internal calibration value INNER_CAL1 according to $$\sum_{i=1}^{m} \Delta i + m \times \Delta f' = 0,$$

where $$\text{INNER\_CAL1} = -\frac{1}{m-2}\left(\sum_{i=1}^{m}\Delta i - \Delta x - \Delta y\right),$$

where $\Delta i$ denotes a frequency offset of the $i^{th}$ reference clock signal relative to the clock signal, output by the local crystal oscillator, on which external calibration has been performed, $\Delta f'$ denotes the frequency offset of the clock signal, output by the local crystal oscillator, on which external calibration has been performed, and $\Delta x$ and $\Delta y$ respectively denote a maximum value and a minimum value among m values calculated according to the formula $$\Delta i = \frac{M_0 - M_{3i}}{M_0}.$$

According to the fourth possible implementation manner of the first aspect, in a fifth possible implementation manner, the performing frequency offset detection on a tracked reference clock signal by using the calibrated clock signal output by the local crystal oscillator includes:

calculating a frequency offset $\Delta f_i$ of the $i^{th}$ reference clock signal, where $\Delta f_i = \Delta i + \text{EXT\_CAL} + \text{INNER\_CAL1}$;

determining whether a formula $-4.6\text{ ppm} \le \Delta f_i \le 4.6\text{ ppm}$ is true;

if the formula $-4.6\text{ ppm} \le \Delta f_i \le 4.6\text{ ppm}$ is true, determining that the frequency offset of the $i^{th}$ reference clock signal meets required precision; and selecting, from j reference clock signals whose frequency offsets meet the required precision, a reference clock signal with a minimum absolute value of a frequency offset as a system clock signal of the network element device, where j is an integer greater than or equal to 1 and less than or equal to m, where ppm is parts per million.

According to the first aspect, in a sixth possible implementation manner, the calibrating a frequency offset of a clock signal output by a local crystal oscillator of a network element device includes:

calculating an internal calibration value INNER_CAL according to n fifth count values $N_{5k}$ on n fifth counters and a third reference value $N_0$, where $N_{5k}$ denotes a count value obtained by the $k^{th}$ fifth counter by counting rising edges of the clock signal output by the local crystal oscillator, $N_0$ denotes a count value obtained, when the $k^{th}$ reference clock signal has no frequency offset and the clock signal output by the local crystal oscillator has no frequency offset, by the $k^{th}$ fifth counter by counting the rising edges of the clock signal output by the local crystal oscillator, and $$N_0 = \frac{A' \times f_0'}{f_k},$$

where A' is a second preset count value, A' is determined according to required precision of calibration performed on the frequency offset of the clock signal output by the local crystal oscillator, $f_0'$ denotes a frequency existing when the clock signal output by the local crystal oscillator has no frequency offset, and $f_k$ denotes a frequency existing when the $k^{th}$ reference clock signal has no frequency offset; and n reference clock signals are clock signals extracted from received service signals by the local crystal oscillator, n is an integer greater than 2, and k is an integer greater than or equal to 1 and less than or equal to n; and performing, according to INNER_CAL, internal calibration on the frequency offset of the clock signal output by the local crystal oscillator.

According to the sixth possible implementation manner of the first aspect, in a seventh possible implementation manner, the calculating an internal calibration value INNER_CAL according to n fifth count values $N_{5k}$ on n fifth counters and a third reference value $N_0$ includes:

resetting count values on n sixth counters and count values on the n fifth counters, and starting the n fifth counters and the n sixth counters simultaneously, where the n sixth counters separately count rising edges of the n reference clock signals:

determining whether a sixth count value $N_{6k}$ on the $k^{th}$ sixth counter is greater than or equal to A', where $N_{6k}$ denotes a count value obtained by the $k^{th}$ sixth counter by counting rising edges of the $k^{th}$ reference clock signal;

if the sixth count value $N_{6k}$ on the $k^{th}$ sixth counter is greater than or equal to A', stopping the counting of the $k^{th}$ sixth counter, resetting the $k^{th}$ sixth counter, and sending a stop signal to the $k^{th}$ fifth counter, so that the $k^{th}$ fifth counter stops counting and reads $N_{5k}$;

calculating $$\Delta k = \frac{N_0 - N_{5k}}{N_0}$$

according to $N_{5k}$ and $N_0$; and calculating the internal calibration value INNER_CAL according to $$\sum_{k=1}^{n} \Delta k + n \times \Delta f' = 0,$$

where $$\text{INNER\_CAL} = -\frac{1}{n-2}\left(\sum_{k=1}^{n} \Delta k - \Delta m - \Delta n\right),$$

where $\Delta k$ denotes a frequency offset of the $k^{th}$ reference clock signal relative to the clock signal output by the local crystal oscillator, $\Delta f'$ denotes a frequency offset of the clock signal output by the local crystal oscillator, and $\Delta m$ and $\Delta n$ respectively denote a maximum value and a minimum value among n values calculated according to the formula $$\Delta k = \frac{N_0 - N_{5k}}{N_0}.$$

According to the seventh possible implementation manner of the first aspect, in an eighth possible implementation manner, the performing frequency offset detection on a tracked reference clock signal by using the calibrated clock signal output by the local crystal oscillator includes:

calculating a frequency offset $\Delta f_k$ of the $k^{th}$ reference clock signal, where $\Delta f_k = \Delta k + \text{INNER\_CAL}$;

determining whether a formula $-4.6 \text{ ppm} \leq \Delta f_k \leq 4.6 \text{ ppm}$ is true;

if the formula $-4.6 \text{ ppm} \leq \Delta f_k \leq 4.6 \text{ ppm}$ is true, determining that the frequency offset of the $k^{th}$ reference clock signal meets required precision; and selecting, from p reference clock signals whose frequency offsets meet the required precision, a reference clock signal with a minimum absolute value of a frequency offset as a system clock signal of the network element device, where p is an integer greater than or equal to 1 and less than or equal to n, where ppm is parts per million.

According to a second aspect, an embodiment of the present invention provides a frequency offset detection apparatus, including:

a frequency offset calibration module, configured to calibrate a frequency offset of a clock signal output by a local crystal oscillator of a network element device; and a frequency offset detection module, configured to perform frequency offset detection on a tracked reference clock signal by using the calibrated clock signal output by the local crystal oscillator.

In a first possible implementation manner of the second aspect, the frequency offset calibration module includes:

an external calibration value calculation unit, configured to calculate an external calibration value EXT_CAL according to a first count value X on a first counter and a first reference value $X_0$, where X denotes a count value obtained, when a reference clock signal input to the local crystal oscillator through an external clock interface has no frequency offset, by the first counter by counting rising edges of the clock signal output by the local crystal oscillator, $X_0$ denotes a count value obtained, when the clock signal output by the local crystal oscillator has no frequency offset and the reference clock signal input to the local crystal oscillator through the external clock interface has no frequency offset, by the first counter by counting the rising edges of the clock signal output by the local crystal oscillator, and $$X_0 = \frac{A \times f_0}{f},$$

where A is a first preset count value, A is determined according to required precision of calibration performed on the frequency offset of the clock signal output by the local crystal oscillator, $f_0$ denotes a frequency existing when the clock signal output by the local crystal oscillator has no frequency offset, and f denotes a frequency existing when the reference clock signal input to the local crystal oscillator through the external clock interface has no frequency offset; and an external calibration unit, configured to perform, according to EXT_CAL, external calibration on the frequency offset of the clock signal output by the local crystal oscillator.

According to the first possible implementation manner of the second aspect, in a second possible implementation manner, the external calibration value calculation unit is specifically configured to: reset a second counter and the first counter, and start the first counter and the second counter simultaneously, where the second counter counts rising edges of the reference clock signal input to the local crystal oscillator through the external clock interface; determine whether a second count value on the second counter is greater than or equal to A; if the second count value on the second counter is greater than or equal to A, stop the counting of the second counter, reset the second counter, and send a stop signal to the first counter, so that the first counter stops counting and reads X; and calculate EXT_CAL according to X and $X_0$, where $$\text{EXT\_CAL} = \frac{X - X_0}{X_0} + \Delta f,$$

where $\Delta f$ denotes a frequency offset of the reference clock signal input to the local crystal oscillator through the external clock interface.

According to the first or second possible implementation manner of the second aspect, in a third possible implementation manner, the apparatus further includes:

a first internal calibration value calculation unit, configured to: after external calibration is performed, according to EXT_CAL, on the frequency offset of the clock signal output by the local crystal oscillator, calculate an internal calibration value INNER_CAL1 according to m third count values $M_{3i}$ on m third counters and a second reference value $M_0$, where $M_{3i}$ denotes a count value obtained by the $i^{th}$ third counter by counting rising edges of the clock signal, output by the local crystal oscillator, on which external calibration has been performed, $M_0$ denotes a count value obtained, when the $i^{th}$ reference clock signal has no frequency offset, by the $i^{th}$ third counter by counting the rising edges of the clock signal, output by the local crystal oscillator, on which external calibration has been performed, $M_0=X_0\times(1+\text{EXT\_CAL})$, m reference clock signals are clock signals extracted from received service signals by the local crystal oscillator, m is an integer greater than 2, and i is an integer greater than or equal to 1 and less than or equal to m; and a first internal calibration unit, configured to perform, according to INNER_CAL1, internal calibration on a frequency offset of the clock signal, output by the local crystal oscillator, on which external calibration has been performed.

According to the third possible implementation manner of the second aspect, in a fourth possible implementation manner, the first internal calibration value calculation unit is specifically configured to: reset m fourth counters and the m third counters, and start the m third counters and the m fourth counters simultaneously, where the m fourth counters separately count rising edges of m reference clock signals, and the m reference clock signals are clock signals extracted from received service signals by the local crystal oscillator; determine whether a fourth count value $M_{4i}$ on the $i^{th}$ fourth counter is greater than or equal to A, where $M_{4i}$ denotes a count value obtained by the $i^{th}$ fourth counter by counting rising edges of the $i^{th}$ reference clock signal; if the fourth count value $M_{4i}$ on the $i^{th}$ fourth counter is greater than or equal to A, stop the counting of the $i^{th}$ fourth counter, reset the $i^{th}$ fourth counter, and send a stop signal to the $i^{th}$ third counter, so that the $i^{th}$ third counter stops counting and reads $M_{3i}$; calculate $$\Delta i = \frac{M_0 - M_{3i}}{M_0}$$

according to $M_{3i}$ and $M_0$; and calculate the internal calibration value INNER_CAL1 according to $$\sum_{i=1}^{m}\Delta i + m\times\Delta f' = 0,$$

where $$\text{INNER\_CAL1} = -\frac{1}{m-2}\left(\sum_{i=1}^{m}\Delta i - \Delta x - \Delta y\right),$$

where $\Delta i$ denotes a frequency offset of the $i^{th}$ reference clock signal relative to the clock signal, output by the local crystal oscillator, on which external calibration has been performed, $\Delta f'$ denotes the frequency offset of the clock signal, output by the local crystal oscillator, on which external calibration has been performed, and $\Delta x$ and $\Delta y$ respectively denote a maximum value and a minimum value among m values calculated according to the formula $$\Delta i = \frac{M_0 - M_{3i}}{M_0}.$$

According to the fourth possible implementation manner of the second aspect, in a fifth possible implementation manner, the frequency offset detection module is specifically configured to: calculate a frequency offset $\Delta f_i$ of the $i^{th}$ reference clock signal, where $\Delta f_i = \Delta i + \text{EXT\_CAL} + \text{INNER\_CAL1}$; determine whether a formula $-4.6\text{ ppm}\leq\Delta f_i\leq 4.6\text{ ppm}$ is true; if the formula $-4.6\text{ ppm}\leq\Delta f_i\leq 4.6\text{ ppm}$ is true, determine that the frequency offset of the $i^{th}$ reference clock signal meets required precision; and select, from j reference clock signals whose frequency offsets meet the required precision, a reference clock signal with a minimum absolute value of a frequency offset as a system clock signal of the network element device, where j is an integer greater than or equal to I and less than or equal to m, and ppm is parts per million.

According to the second aspect, in a sixth possible implementation manner, the frequency offset calibration module includes:

a second internal calibration value calculation unit, configured to calculate an internal calibration value INNER_CAL according to n fifth count values $N_{5k}$ on n fifth counters and a third reference value $N_0$, where $N_{5k}$ denotes a count value obtained by the $k^{th}$ fifth counter by counting rising edges of the clock signal output by the local crystal oscillator, $N_0$ denotes a count value obtained, when the $k^{th}$ reference clock signal has no frequency offset and the clock signal output by the local crystal oscillator has no frequency offset, by the $k^{th}$ fifth counter by counting the rising edges of the clock signal output by the local crystal oscillator, and $$N_0 = \frac{A'\times f_0'}{f_k},$$

where A' is a second preset count value, A' is determined according to required precision of calibration performed on the frequency offset of the clock signal output by the local crystal oscillator, $f_0'$ denotes a frequency existing when the clock signal output by the local crystal oscillator has no frequency offset, and $f_k$ denotes a frequency existing when the $k^{th}$ reference clock signal has no frequency offset; and n reference clock signals are clock signals extracted from received service signals by the local crystal oscillator, n is an integer greater than 2, and k is an integer greater than or equal to 1 and less than or equal to n; and a second internal calibration unit, configured to perform, according to INNER_CAL, internal calibration on the frequency offset of the clock signal output by the local crystal oscillator.

According to the sixth possible implementation manner of the second aspect, in a seventh possible implementation manner, the second internal calibration value calculation unit is specifically configured to: reset count values on n sixth counters and count values on the n fifth counters, and start the n fifth counters and the n sixth counters simultaneously, where the n sixth counters separately count rising edges of the n reference clock signals; determine whether a sixth count value $N_{6k}$ on the $k^{th}$ sixth counter is greater than or equal to A', where $N_{6k}$ denotes a count value obtained by the $k^{th}$ sixth counter by counting rising edges of the $k^{th}$ reference clock signal; if the sixth count value $N_{6k}$ on the $k^{th}$ sixth counter is greater than or equal to A', stop the counting of the $k^{th}$ sixth counter, reset the $k^{th}$ sixth counter, and send a stop signal to the $k^{th}$ fifth counter, so that the $k^{th}$ fifth counter stops counting and reads $N_{5k}$; calculate $$\Delta k = \frac{N_0 - N_{5k}}{N_0}$$

according to $N_{5k}$ and $N_0$; and calculate the internal calibration value INNER_CAL according to $$\sum_{k=1}^{n} \Delta k + n \times \Delta f' = 0,$$

where $$\text{INNER\_CAL} = -\frac{1}{n-2}\left(\sum_{k=1}^{n} \Delta k - \Delta m - \Delta n\right),$$

where $\Delta k$ denotes a frequency offset of the $k^{th}$ reference clock signal relative to the clock signal output by the local crystal oscillator, $\Delta f'$ denotes a frequency offset of the clock signal output by the local crystal oscillator, and $\Delta m$ and $\Delta n$ respectively denote a maximum value and a minimum value among n values calculated according to the formula $$\Delta k = \frac{N_0 - N_{5k}}{N_0}.$$

According to the seventh possible implementation manner of the second aspect, in an eighth possible implementation manner, the frequency offset detection module is specifically configured to: calculate a frequency offset $\Delta f_k$ of the $k^{th}$ reference clock signal, where $\Delta f_k = \Delta k + \text{INNER\_CAL}$; determine whether a formula $-4.6\text{ ppm} \leq \Delta f_k \leq 4.6\text{ ppm}$ is true; if the formula $-4.6\text{ ppm} \leq \Delta f_k \leq 4.6\text{ ppm}$ is true, determine that the frequency offset of the $k^{th}$ reference clock signal meets required precision; and select, from p reference clock signals whose frequency offsets meet the required precision, a reference clock signal with a minimum absolute value of a frequency offset as a system clock signal of the network element device, where p is an integer greater than or equal to 1 and less than or equal to n, and ppm is parts per million.

According to the frequency offset detection method and apparatus in the embodiments of the present invention, a frequency offset of a clock signal output by a local crystal oscillator of a network element device is calibrated, and frequency offset detection is performed on a tracked reference clock signal by using the calibrated clock signal output by the local crystal oscillator, thereby solving a problem in the prior art that a detection result for a frequency offset of a reference clock signal is inaccurate because of an existence of a frequency offset of a local crystal oscillator and a parameter drift caused by aging, and improving detection precision without replacing hardware.

BRIEF DESCRIPTION OF DRAWINGS

To describe the technical solutions in the embodiments of the present invention or in the prior art more clearly, the following briefly introduces the accompanying drawings required for describing the embodiments or the prior art. Apparently, the accompanying drawings in the following description show some embodiments of the present invention, and persons of ordinary skill in the art may still derive other drawings from these accompanying drawings without creative efforts.

DESCRIPTION OF EMBODIMENTS

To make the objectives, technical solutions, and advantages of the embodiments of the present invention clearer, the following clearly describes the technical solutions in the embodiments of the present invention with reference to the accompanying drawings in the embodiments of the present invention. Apparently, the described embodiments are some but not all of the embodiments of the present invention. All other embodiments obtained by persons of ordinary skill in the art based on the embodiments of the present invention without creative efforts shall fall within the protection scope of the present invention.

Figure 1:
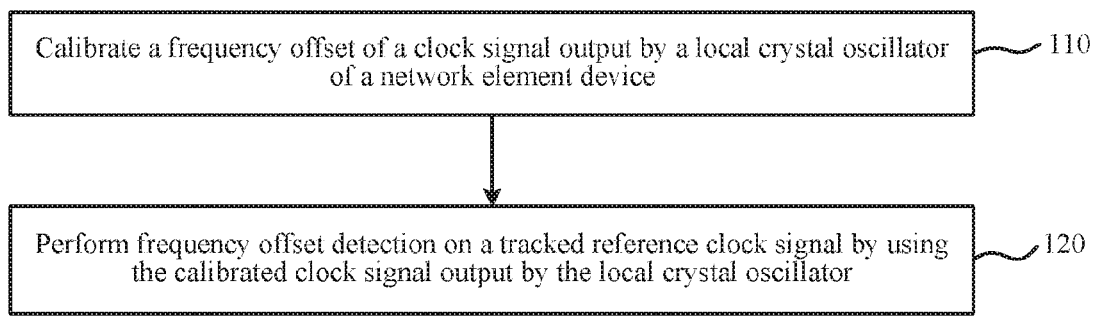
FIG. 1 is a flowchart of a frequency offset detection method according to Embodiment 1 of the present invention.

FIG. 1 is a flowchart of a frequency offset detection method according to Embodiment 1 of the present invention. The method in this embodiment is applicable to a scenario in which frequency offset detection is performed on a reference clock signal on an SDH network. The method is executed by a frequency offset detection apparatus of a network element device configured on the SDH network, and the apparatus is generally implemented in a hardware and/or software manner. The method in this embodiment includes the following:

110. Calibrate a frequency offset of a clock signal output by a local crystal oscillator of the network element device.

In the prior art, whether a frequency offset occurs in a reference clock signal is detected in a manner of counting rising edges of the reference clock signal by using a clock signal output by a local crystal oscillator of a network element device. However, a precondition of using the manner to detect whether the frequency offset occurs in the reference clock signal is that the clock signal output by the local crystal oscillator is accurate, and has no frequency offset. To ensure that the clock signal output by the local crystal oscillator is accurate, a constant-temperature crystal oscillator is generally used as the local crystal oscillator of the network element device. However, the constant-temperature crystal oscillator also unavoidably has a frequency offset when being delivered from a factory, and has a frequency offset because of a parameter drift caused by aging, which decreases detection precision or even results in a false detection. Moreover, after a frequency offset occurs in constant-temperature crystal oscillator, the frequency offset cannot be calibrated, and the frequency offset problem can be solved only by replacing hardware. In step 110 in this embodiment, the frequency offset of the clock signal output by the local crystal oscillator of the network element device is calibrated, so that precision of frequency offset detection performed on a reference clock signal by using a clock signal output by a constant-temperature crystal oscillator can be improved, to ensure that the tracked reference clock signal meets requirements of International Telecommunications Union Telecommunication Standardization Sector (International Telecommunications Union Telecommunication Standardization Sector, ITU-T for short) G.813.

120. Perform frequency offset detection on a tracked reference clock signal by using the calibrated clock signal output by the local crystal oscillator.

In step 120, frequency offset detection is performed on the tracked reference clock signal by using the calibrated clock signal output by the local crystal oscillator, so that a deviation, caused by the frequency offset of the clock signal output by the local crystal oscillator, of the frequency offset detection performed on the reference clock signal can be compensated, and a precise detection result can be acquired.

According to the frequency offset detection method provided by this embodiment, frequency offset detection is performed on a tracked reference clock signal by using a calibrated clock signal output by a local crystal oscillator, thereby improving precision of frequency offset detection performed on the reference clock signal by using the clock signal output by the local crystal oscillator, and ensuring that precision of frequency offset detection performed on the tracked reference clock signal meets requirements of ITU-T G.813.

Figure 2:
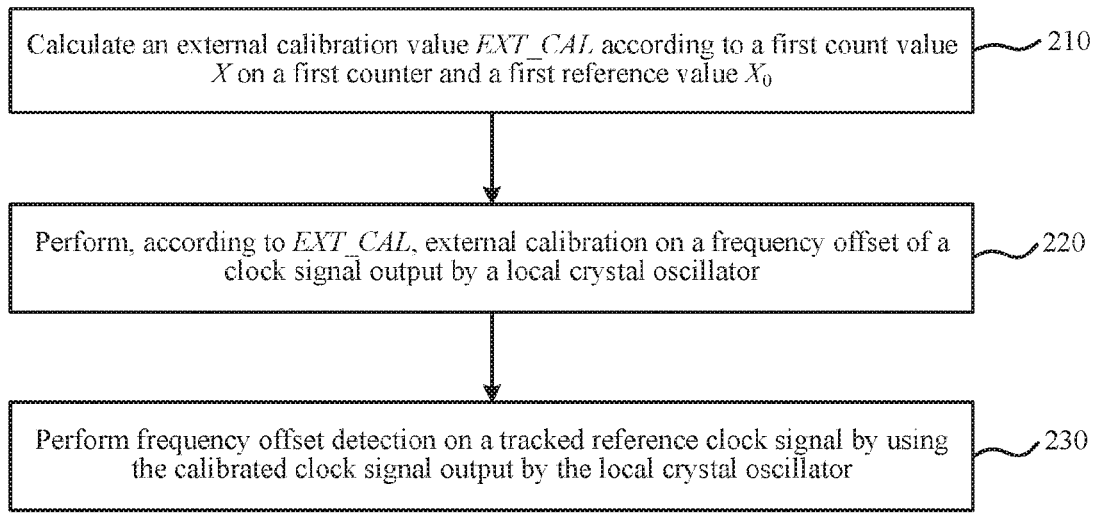
FIG. 2 is a flowchart of a frequency offset detection method according to Embodiment 2 of the present invention.

FIG. 2 is a flowchart of a frequency offset detection method according to Embodiment 2 of the present invention. In this embodiment, external calibration is performed on a frequency offset of a clock signal output by a local crystal oscillator, and frequency offset detection is performed on a reference clock signal by using the clock signal, output by the local crystal oscillator, on which external calibration has been performed. This embodiment is further optimized based on Embodiment 1. Referring to FIG. 2, the method in this embodiment may include:

210. Calculate an external calibration value EXT_CAL according to a first count value X on a first counter and a first reference value $X_0$.

X denotes a count value obtained, when a reference clock signal input to the local crystal oscillator through an external clock interface has no frequency offset, by the first counter by counting rising edges of the clock signal output by the local crystal oscillator, $X_0$ denotes a count value obtained, when the clock signal output by the local crystal oscillator has no frequency offset and the reference clock signal input to the local crystal oscillator through the external clock interface has no frequency offset, by the first counter by counting the rising edges of the clock signal output by the local crystal oscillator, and $$X_0 = \frac{A \times f_0}{f},$$

where A is a first preset count value. A is determined according to required precision of calibration performed on a frequency offset of the clock signal output by the local crystal oscillator, $f_0$ denotes a frequency existing when the clock signal output by the local crystal oscillator has no frequency offset, and f denotes a frequency existing when the reference clock signal input to the local crystal oscillator through the external clock interface has no frequency offset.

It should be noted that in an actual application, a constant-temperature crystal oscillator with high stability is generally used as a local crystal oscillator. Assuming that a frequency offset of the reference clock signal input to the local crystal oscillator through the external clock interface is 0, and rising edges of the reference clock signal input to the local crystal oscillator through the external clock interface are counted for A cycles, a time period used to perform counting for the A cycles is A/f, where a unit is second, and a count value obtained by the first counter by counting, within the same time period, rising edges of a clock signal output by the local crystal oscillator is X. It can be seen from the formula $$X_0 = \frac{A \times f_0}{f}$$

that when a frequency of the clock signal output by the local crystal oscillator is greater than $f_0$, that is, when the clock signal output by the local crystal oscillator has a positive frequency offset, the first count value X on the first counter in the same count cycle is larger, that is, the first count value X is greater than $X_0$; and when the clock signal output by the local crystal oscillator has a negative frequency offset, the count value X on the first counter is less than $X_0$. The difference between the count value X on the first counter and $X_0$ reflects a value of the frequency offset of the clock signal output by the local crystal oscillator, and further, the frequency offset of the clock signal output by the local crystal oscillator can be calculated according to the difference between X and $X_0$.

For example, the calculating an external calibration value EXT_CAL according to a first count value X on a first counter and a first reference value $X_0$ may be implemented in the following manner:

resetting a second counter and the first counter, and starting the first counter and the second counter simultaneously, where the second counter counts rising edges of the reference clock signal input to the local crystal oscillator through the external clock interface; determining whether a second count value on the second counter is greater than or equal to A; if the second count value on the second counter is greater than or equal to A, stopping the counting of the second counter, resetting the second counter, and sending a stop signal to the first counter, so that the first counter stops counting and reads X; and calculating EXT_CAL according to X and $X_0$, where $$\text{EXT\_CAL} = \frac{X - X_0}{X_0} + \Delta f,$$

where Δf denotes a frequency offset of the reference clock signal input to the local crystal oscillator through the external clock interface.

It should be noted that in a process of determining whether the second count value on the second counter is greater than or equal to A, if it is determined that the second count value on the second counter is less than A, the second counter is controlled to continue to count the rising edges of the reference clock signal input to the local crystal oscillator through the external clock interface. The method for calculating EXT_CAL is introduced in detail in step 210, and if a user does not use an external calibration method in an actual application, it may be determined that EXT_CAL=0.

220. Perform, according to EXT_CAL, external calibration on a frequency offset of a clock signal output by a local crystal oscillator.

EXT_CAL is the frequency offset of the clock signal output by the local crystal oscillator, and frequency offset detection may be performed, according to the external calibration value EXT_CAL, on the reference clock signal input to the local crystal oscillator through the external clock interface.

230. Perform frequency offset detection on a tracked reference clock signal by using the calibrated clock signal output by the local crystal oscillator.

Because EXT_CAL is calculated in 210 to 220, when frequency offset detection is performed on the tracked reference clock signal, a detection result may be modified, and an accurate detection result may be acquired.

According to the frequency offset detection method provided by this embodiment, EXT_CAL is calculated, external calibration is performed, according to EXT_CAL, on a frequency offset of a clock signal output by a local crystal oscillator, and frequency offset detection is performed on a tracked reference clock signal by using the calibrated clock signal output by the local crystal oscillator, thereby improving precision of frequency offset detection performed on the reference clock signal by using the clock signal output by the local crystal oscillator, and ensuring that precision of frequency offset detection performed on the tracked reference clock signal meets requirements of ITU-T G.813.

Figure 3:
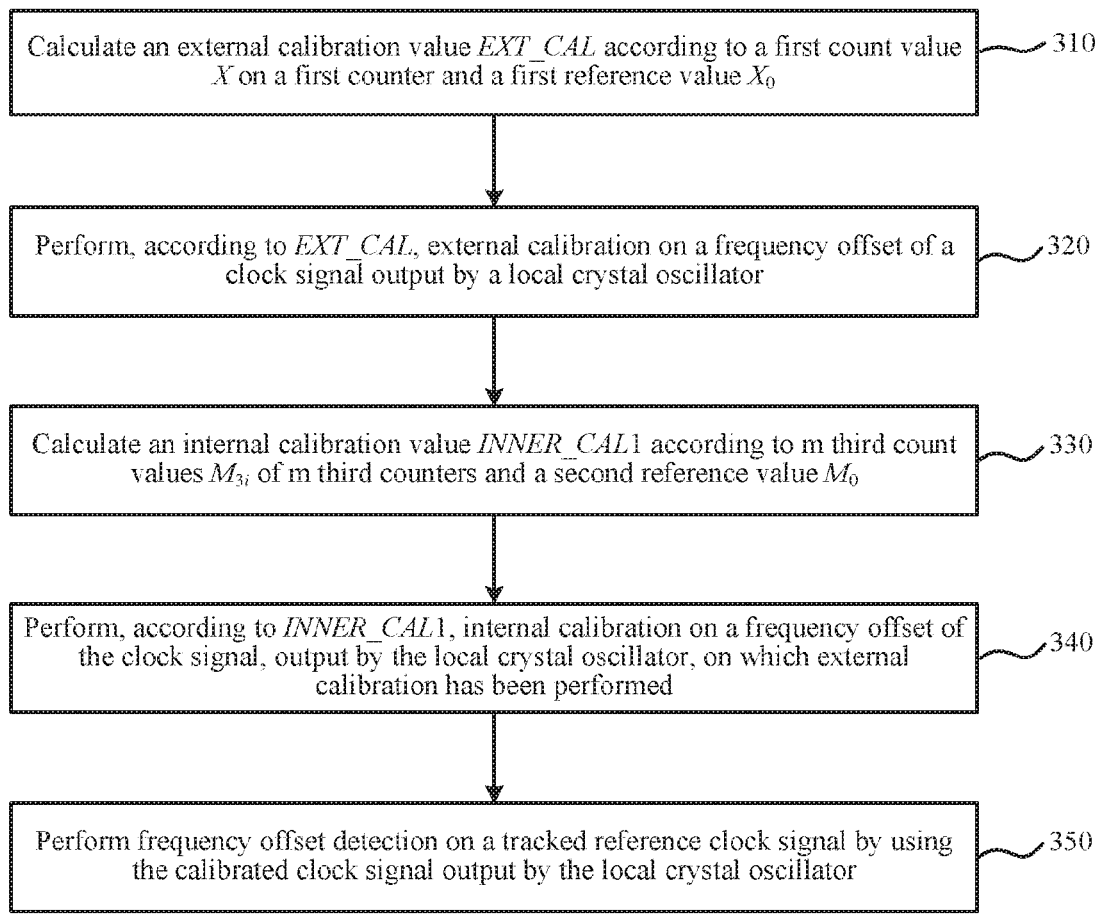
FIG. 3 is a flowchart of a frequency offset detection method according to Embodiment 3 of the present invention.

FIG. 3 is a flowchart of a frequency offset detection method according to Embodiment 3 of the present invention. In this embodiment, external calibration is performed on a frequency offset of a clock signal output by a local crystal oscillator, internal calibration is then performed after external calibration is performed, and frequency offset detection is performed on a reference clock signal by using the clock signal, output by the local crystal oscillator, on which external calibration and internal calibration have been performed. Referring to FIG. 3, the method in this embodiment may include:

310. Calculate an external calibration value EXT_CAL according to a first count value X on a first counter and a first reference value $X_0$.

320. Perform, according to EXT_CAL, external calibration on a frequency offset of a clock signal output by a local crystal oscillator.

330. Calculate an internal calibration value INNER_CAL1 according to m third count values $M_{3i}$ on m third counters and a second reference value $M_0$.

$M_{3i}$ denotes a count value obtained by the $i^{th}$ third counter by counting rising edges of the clock signal, output by the local crystal oscillator, on which external calibration has been performed, $M_0$ denotes a count value obtained, when the $i^{th}$ reference clock signal has no frequency offset, by the $i^{th}$ third counter by counting the rising edges of the clock signal, output by the local crystal oscillator, on which external calibration has been performed, $M_0 = X_0 \times (1+\text{EXT\_CAL})$, m reference clock signals are clock signals extracted from received service signals by the local crystal oscillator, m is an integer greater than 2, and i is an integer greater than or equal to 1 and less than or equal to m.

For example, the calculating an internal calibration value INNER_CAL1 according to m third count values $M_{3i}$ on m third counters and a second reference value $M_0$ may be implemented in the following manner:

resetting m fourth counters and the m third counters, and starting the m third counters and the m fourth counters simultaneously, where the m fourth counters separately count rising edges of m reference clock signals, and the m reference clock signals are clock signals extracted from received service signals by the local crystal oscillator; determining whether a fourth count value $M_{4i}$ on the $i^{th}$ fourth counter is greater than or equal to A, where $M_{4i}$ denotes a count value obtained by the $i^{th}$ fourth counter by counting rising edges of the $i^{th}$ reference clock signal; if the fourth count value $M_{4i}$ on the $i^{th}$ fourth counter is greater than or equal to A, stopping the counting of the $i^{th}$ fourth counter, resetting the $i^{th}$ fourth counter, and sending a stop signal to the $i^{th}$ third counter, so that the $i^{th}$ third counter stops counting and reads $M_{3i}$; calculating $$\Delta i = \frac{M_0 - M_{3i}}{M_0}$$

according to $M_{3i}$ and $M_0$; and calculating the internal calibration value INNER_CAL1 according to $$\sum_{i=1}^{m} \Delta i + m \times \Delta f' = 0,$$

where $$\text{INNER\_CAL1} = -\frac{1}{m-2}\left(\sum_{i=1}^{m} \Delta i - \Delta x - \Delta y\right),$$

where $\Delta i$ denotes a frequency offset of the $i^{th}$ reference clock signal relative to the clock signal, output by the local crystal oscillator, on which external calibration has been performed, $\Delta f'$ denotes a frequency offset of the clock signal, output by the local crystal oscillator, on which external calibration has been performed, and $\Delta x$ and $\Delta y$ respectively denote a maximum value and a minimum value among m values calculated according to the formula $$\Delta i = \frac{M_0 - M_{3i}}{M_0}.$$

It should be noted that in a process of calculating an internal calibration value INNER_CAL1, because a value of m is limited, when a frequency offset of a reference clock signal is relatively large, a frequency offset result of the clock signal, output by the local crystal oscillator, on which external calibration has been performed is affected. Therefore, in a design process, the maximum value $\Delta x$ and the minimum value $\Delta y$ among the m values calculated according to the formula $$\Delta i = \frac{M_0 - M_{3i}}{M_0}$$

are removed, the remaining m−2 frequency offset calculation results are averaged after being added up, to obtain the frequency offset of the clock signal, output by the local crystal oscillator, on which external calibration has been performed, and the frequency offset is used as the internal calibration value of the clock signal, output by the local crystal oscillator, on which external calibration has been performed. Herein, it should be noted that in this embodiment, other statistical algorithms may be used as the method for calculating an internal calibration value, to achieve a more precise calibration effect.

In the foregoing process of determining whether the fourth count value $M_{4i}$ on the $i^{th}$ fourth counter is greater than or equal to A, if it is determined that the fourth count value $M_{4i}$ on the $i^{th}$ fourth counter is less than A, the $i^{th}$ fourth counter is controlled to continue to count the rising edges of the $i^{th}$ reference clock signal.

340. Perform, according to INNER_CAL1, internal calibration on a frequency offset of the clock signal, output by the local crystal oscillator, on which external calibration has been performed.

350: Perform frequency offset detection on a tracked reference clock signal by using the calibrated clock signal output by the local crystal oscillator.

For example, the performing frequency offset detection on a tracked reference clock signal by using the calibrated clock signal output by the local crystal oscillator may be implemented in the following manner:

calculating a frequency offset $\Delta f_i$ of the $i^{th}$ reference clock signal, where $$\Delta f_i = \frac{M_0 - M_{3i}}{M_0} + EXT\_CAL + INNER\_CAL1;$$

determining whether a formula −4.6 ppm≤$\Delta f_i$≤4.6 ppm is true; if the formula −4.6 ppm≤$\Delta f_i$≤4.6 ppm is true, determining that the frequency offset of the $i^{th}$ reference clock signal meets required precision; and selecting, from j reference clock signals whose frequency offsets meet the required precision, a reference clock signal with a minimum absolute value of a frequency offset as a system clock signal of the network element device, where j is an integer greater than or equal to 1 and less than or equal to m, and ppm is parts per million.

According to the frequency offset detection method provided by this embodiment, EXT_CAL is calculated, external calibration is performed, according to EXT_CAL, on a frequency offset of a clock signal output by a local crystal oscillator, INNER_CAL1 is further calculated after external calibration is performed, internal calibration is then performed, according to INNER_CAL1, on a frequency offset of the clock signal, output by the local crystal oscillator, on which external calibration has been performed, and frequency offset detection is performed on a tracked reference clock signal by using the clock signal, output by the local crystal oscillator, on which external calibration and internal calibration have been performed, thereby improving precision of frequency offset detection performed on the reference clock signal by using the clock signal output by the local crystal oscillator, and ensuring that the precision of frequency offset detection performed on the tracked reference clock signal meets requirements of ITU-T G.813.

Figure 4:
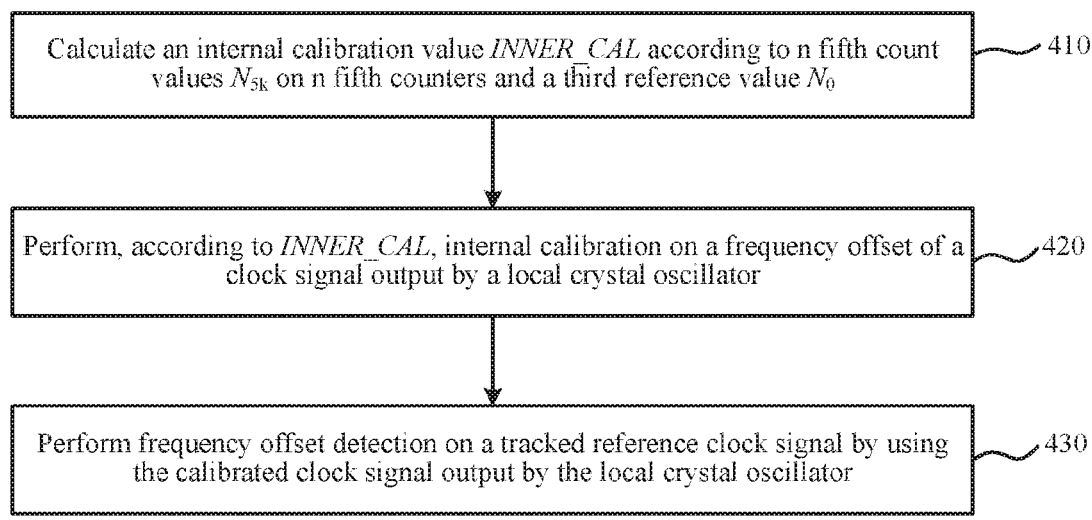
FIG. 4 is a flowchart of a frequency offset detection method according to Embodiment 4 of the present invention.

FIG. 4 is a flowchart of a frequency offset detection method according to Embodiment 4 of the present invention. In this embodiment, internal calibration is performed on a frequency offset of a clock signal output by a local crystal oscillator, and frequency offset detection is performed on a reference clock signal by using a clock signal, output by the local crystal oscillator, on which internal calibration has been performed. Referring to FIG. 4, the method in this embodiment may include:

410. Calculate an internal calibration value INNER_CAL according to n fifth count values $N_{5k}$ on n fifth counters and a third reference value $N_0$.

$N_{5k}$ denotes a count value obtained by the $k^{th}$ fifth counter by counting rising edges of a clock signal output by a local crystal oscillator, $N_0$ denotes a count value obtained, when the $k^{th}$ reference clock signal has no frequency offset and the clock signal output by the local crystal oscillator has no frequency offset, by the $k^{th}$ fifth counter by counting the rising edges of the clock signal output by the local crystal oscillator, and $$N_0 = \frac{A' \times f_0'}{f_k},$$

where A' is a second preset count value, A' is determined according to required precision of calibration performed on the frequency offset of the clock signal output by the local crystal oscillator, $f_0'$ denotes a frequency existing when the clock signal output by the local crystal oscillator has no frequency offset, and $f_k$ denotes a frequency existing when the $k^{th}$ reference clock signal has no frequency offset; n reference clock signals are clock signals extracted from received service signals by the local crystal oscillator, n is an integer greater than 2, and k is an integer greater than or equal to 1 and less than or equal to n.

For example, the calculating an internal calibration value INNER_CAL according to n fifth count values $N_{5k}$ on n fifth counters and a third reference value $N_0$ may be implemented in the following manner:

resetting count values on n sixth counters and count values on the n fifth counters, and starting the n fifth counters and the n sixth counters simultaneously, where the n sixth counters separately count rising edges of the n reference clock signals; determining whether a sixth count value $N_{6k}$ on the $k^{th}$ sixth counter is greater than or equal to A', where $N_{6k}$ denotes a count value obtained by the $k^{th}$ sixth counter by counting rising edges of the $k^{th}$ reference clock signal; if the sixth count value $N_{6k}$ on the $k^{th}$ sixth counter is greater than or equal to A', stopping counting of the $k^{th}$ sixth counter, resetting the $k^{th}$ sixth counter, and sending a stop signal to the $k^{th}$ fifth counter, so that the $k^{th}$ fifth counter stops counting and reads $N_{5k}$; calculating $$\Delta k = \frac{N_0 - N_{5k}}{N_0}$$

according to $N_{5k}$ and $N_0$; and calculating the internal calibration value according to $$\sum_{k=1}^{n} \Delta k + n \times \Delta f' = 0,$$

where $$\text{INNER\_CAL} = -\frac{1}{n-2}\left(\sum_{k=1}^{n}\Delta k - \Delta m - \Delta n\right),$$

where $\Delta k$ denotes a frequency offset of the $k^{th}$ reference clock signal relative to the clock signal output by the local crystal oscillator, $\Delta f'$ denotes a frequency offset of a clock signal output by the local crystal oscillator, and $\Delta m$ and $\Delta n$ respectively denote a maximum value and a minimum value among n values calculated according to the formula $$\Delta k = \frac{N_0 - N_{5k}}{N_0}.$$

It should be noted that in a process of determining whether the sixth count value $N_{6k}$ on the $k^{th}$ sixth counter is greater than or equal to A', if it is determined that the sixth count value $N_{6k}$ on the $k^{th}$ sixth counter is less than A', the $k^{th}$ sixth counter is controlled to continue to count the rising edges of the $k^{th}$ reference clock signal.

420. Perform, according to INNER_CAL, internal calibration on a frequency offset of a clock signal output by a local crystal oscillator.

430. Perform frequency offset detection on a tracked reference clock signal by using the calibrated clock signal output by the local crystal oscillator.

For example, the performing frequency offset detection on a tracked reference clock signal by using the calibrated clock signal output by the local crystal oscillator may be implemented in the following manner:

calculating a frequency offset $\Delta f_k$ of the $k^{th}$ reference clock signal, where $\Delta f_k = \Delta k + \text{INNER\_CAL}$; determining whether a formula $-4.6$ ppm$\leq \Delta f_k \leq 4.6$ ppm is true; if the formula $-4.6$ ppm$\leq \Delta f_k \leq 4.6$ ppm is true, determining that the frequency offset of the $i^{th}$ reference clock signal meets required precision; and selecting, from p reference clock signals whose frequency offsets meet the required precision, a reference clock signal with a minimum absolute value of a frequency offset as a system clock signal of the network element device, where p is an integer greater than or equal to 1 and less than or equal to n, and ppm is parts per million.

According to the frequency offset detection method provided by this embodiment, INNER_CAL is calculated, internal calibration is performed, according to INNER_CAL, on a frequency offset of a clock signal output by a local crystal oscillator, and frequency offset detection is performed on a tracked reference clock signal by using the clock signal, output by the local crystal oscillator, on which internal calibration has been performed, thereby improving precision of frequency offset detection performed on the reference clock signal by using the clock signal output by the local crystal oscillator, and ensuring that the precision of frequency offset detection performed on the tracked reference clock signal meets requirements of ITU-T G.813.

Figure 5:
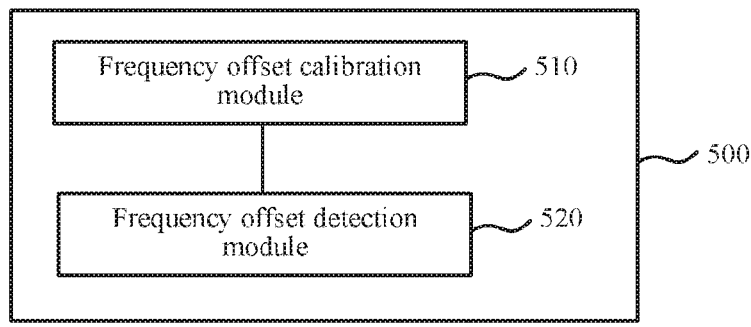
FIG. 5 is a schematic structural diagram of a frequency offset detection apparatus 500 according to Embodiment 5 of the present invention.

FIG. 5 is a schematic structural diagram of a frequency offset detection apparatus 500 according to Embodiment 5 of the present invention. The apparatus in this embodiment is applicable to a scenario in which frequency offset detection is performed on a reference clock signal on an SDH network. The apparatus is generally implemented in a hardware and/or software manner. Referring to FIG. 5, the frequency offset detection apparatus includes the following modules: a frequency offset calibration module 510 and a frequency offset detection module 520.

The frequency offset calibration module 510 is configured to calibrate a frequency offset of a clock signal output by a local crystal oscillator of a network element device; and the frequency offset detection module 520 is configured to perform frequency offset detection on a tracked reference clock signal by using the calibrated clock signal output by the local crystal oscillator.

According to the frequency offset detection apparatus provided by this embodiment, frequency offset detection is performed on a tracked reference clock signal by using a calibrated clock signal output by a local crystal oscillator, thereby improving precision of frequency offset detection performed on the reference clock signal by using the clock signal output by the local crystal oscillator, and ensuring that precision of frequency offset detection performed on the tracked reference clock signal meets requirements of ITU-T G.813.

Figure 6:
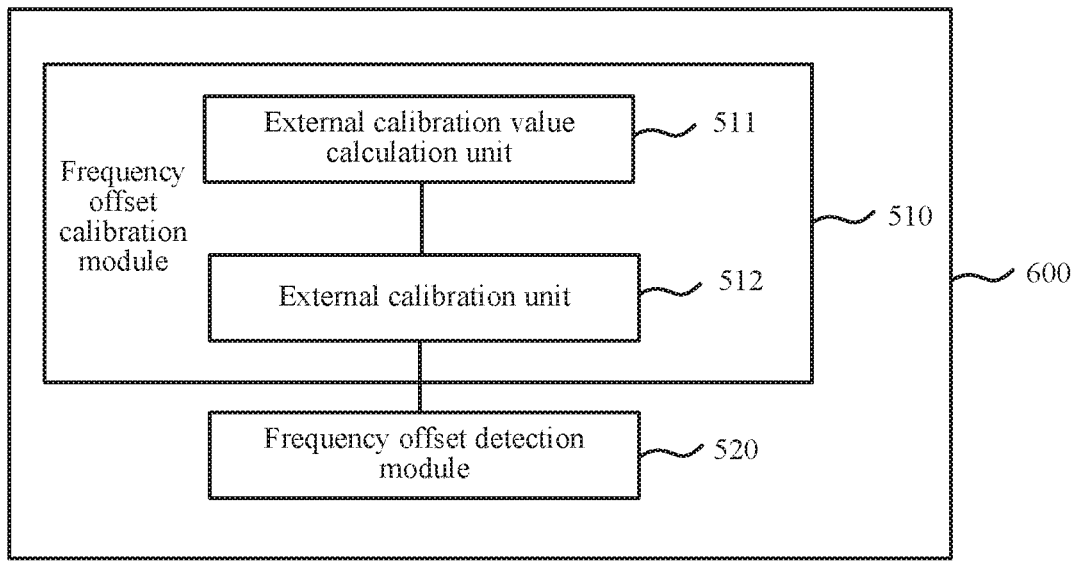
FIG. 6 is a schematic structural diagram of a frequency offset detection apparatus 600 according to Embodiment 6 of the present invention.

FIG. 6 is a schematic structural diagram of a frequency offset detection apparatus 600 according to Embodiment 6 of the present invention. Referring to FIG. 6, on the basis of Embodiment 5, the frequency offset calibration module 510 specifically includes the following units: an external calibration value calculation unit 511 and an external calibration unit 512.

The external calibration value calculation unit 511 is configured to calculate an external calibration value EXT_CAL according to a first count value X on a first counter and a first reference value $X_0$, where X denotes a count value obtained, when a reference clock signal input to the local crystal oscillator through an external clock interface has no frequency offset, by the first counter by counting rising edges of the clock signal output by the local crystal oscillator, $X_0$ denotes a count value obtained, when the clock signal output by the local crystal oscillator has no frequency offset and the reference clock signal input to the local crystal oscillator through the external clock interface has no frequency offset, by the first counter by counting the rising edges of the clock signal output by the local crystal oscillator, and $$X_0 = \frac{A \times f_0}{f},$$

where A is a first preset count value, A is determined according to required precision of calibration performed on the frequency offset of the clock signal output by the local crystal oscillator, $f_0$ denotes a frequency existing when the clock signal output by the local crystal oscillator has no frequency offset, and f denotes a frequency existing when the reference clock signal input to the local crystal oscillator through the external clock interface has no frequency offset. The external calibration unit 512 is configured to perform, according to EXT_CAL, external calibration on the frequency offset of the clock signal output by the local crystal oscillator.

Further, the external calibration value calculation unit 511 is specifically configured to: reset a second counter and the first counter, and start the first counter and the second counter simultaneously, where the second counter counts rising edges of the reference clock signal input to the local crystal oscillator through the external clock interface; determine whether a second count value on the second counter is greater than or equal to A; if the second count value on the second counter is greater than or equal to A, stop the counting of the second counter, reset the second counter, and send a stop signal to the first counter, so that the first counter stops counting and reads X; and calculate EXT_CAL according to X and $X_0$, where $$EXT\_CAL = \frac{X - X_0}{X_0} + \Delta f,$$

where $\Delta f$ denotes a frequency offset of the reference clock signal input to the local crystal oscillator through the external clock interface.

Further, the frequency offset calibration module 510 may further include the following units: a first internal calibration value calculation unit and a first internal calibration unit.

The first internal calibration value calculation unit is configured to: after external calibration is performed, according to EXT_CAL, on the frequency offset of the clock signal output by the local crystal oscillator, calculate an internal calibration value INNER_CAL1 according to m third count values $M_{3i}$ on m third counters, and a second reference value $M_0$, where $M_{3i}$ denotes a count value obtained by the $i^{th}$ third counter by counting rising edges of the clock signal, output by the local crystal oscillator, on which external calibration has been performed, $M_0$ denotes a count value obtained, when the $i^{th}$ reference clock signal has no frequency offset, by the $i^{th}$ third counter by counting the rising edges of the clock signal, output by the local crystal oscillator, on which external calibration has been performed, $M_0 = X_0 \times (1 + EXT\_CAL)$, m reference clock signals are clock signals extracted from received service signals by the local crystal oscillator, m is an integer greater than 2, and i is an integer greater than or equal to 1 and less than or equal to m.

The first internal calibration unit is configured to perform, according to INNER_CAL1, internal calibration on a frequency offset of the clock signal, output by the local crystal oscillator, on which external calibration has been performed.

Further, the first internal calibration value calculation unit is specifically configured to: reset m fourth counters and the m third counters, and start the m third counters and the m fourth counters simultaneously, where the m fourth counters separately count rising edges of m reference clock signals, and the m reference clock signals are clock signals extracted from received service signals by the local crystal oscillator; determine whether a fourth count value $M_{4i}$ on the $i^{th}$ fourth counter is greater than or equal to A, where $M_{4i}$ denotes a count value obtained by the $i^{th}$ fourth counter by counting rising edges of the $i^{th}$ reference clock signal; if the fourth count value $M_{4i}$ on the $i^{th}$ fourth counter is greater than or equal to A, stop the counting of the $i^{th}$ fourth counter, reset the $i^{th}$ fourth counter, and send a stop signal to the $i^{th}$ third counter, so that the $i^{th}$ third counter stops counting and reads $M_{3i}$; calculate $$\Delta i = \frac{M_0 - M_{3i}}{M_0}$$

according to $M_{3i}$ and $M_0$; and calculate the internal calibration value INNER_CAL1 according to $$\sum_{i=1}^{m} \Delta i + m \times \Delta f' = 0,$$

where $$INNER\_CAL1 = -\frac{1}{m-2}\left(\sum_{i=1}^{m} \Delta i - \Delta x - \Delta y\right),$$

where $\Delta i$ denotes a frequency offset of the $i^{th}$ reference clock signal relative to a clock signal, output by the local crystal oscillator, on which external calibration has been performed, $\Delta f'$ denotes the frequency offset of the clock signal, output by the local crystal oscillator, on which external calibration has been performed, and $\Delta x$ and $\Delta y$ respectively denote a maximum value and a minimum value among m values calculated according to the formula $$\Delta i = \frac{M_0 - M_{3i}}{M_0}.$$

Further, the frequency offset detection module 520 is specifically configured to: calculate a frequency offset $\Delta f_i$ of the $i^{th}$ reference clock signal, where $$\Delta f_i = \frac{M_0 - M_{3i}}{M_0} + EXT\_CAL + INNER\_CAL1;$$

determine whether a formula $-4.6$ ppm $\leq \Delta f_i \leq 4.6$ ppm is true; if the formula $-4.6$ ppm $\leq \Delta f_i \leq 4.6$ ppm is true, determine that the frequency offset of the $i^{th}$ reference clock signal meets required precision; and select, from j reference clock signals whose frequency offsets meet the required precision, a reference clock signal with a minimum absolute value of a frequency offset as a system clock signal of the network element device, where j is an integer greater than or equal to 1 and less than or equal to m, and ppm is parts per million.

According to the frequency offset detection apparatus provided by this embodiment, frequency offset detection is performed on a tracked reference clock signal by using a calibrated clock signal output by a local crystal oscillator, thereby improving precision of frequency offset detection performed on the reference clock signal by using the clock signal output by the local crystal oscillator, and ensuring that the tracked reference clock signal meets requirements of ITU-T G.813.

Figure 7:
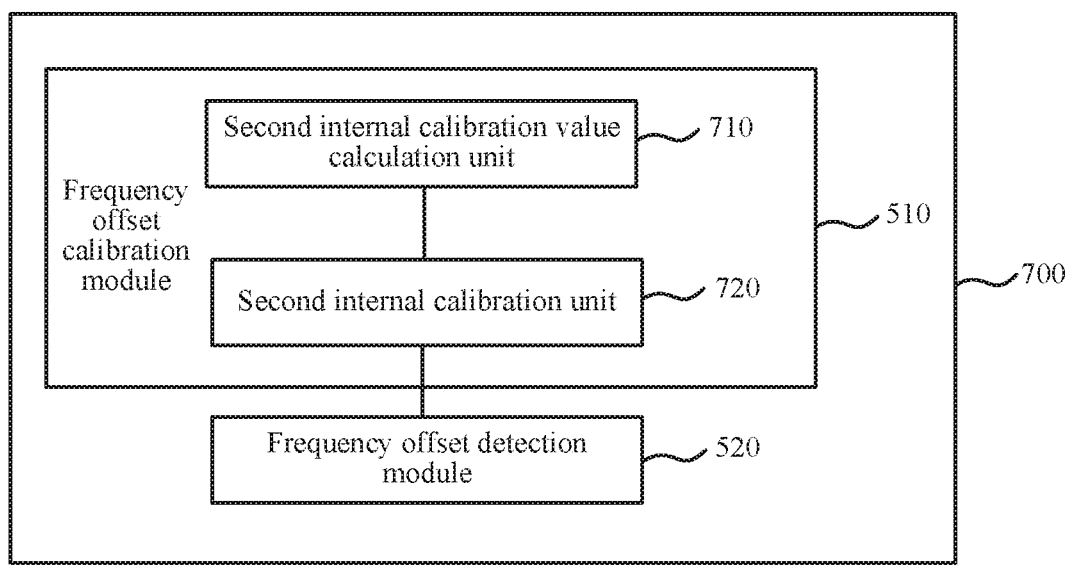
FIG. 7 is a schematic structural diagram of a frequency offset detection apparatus 700 according to Embodiment 7 of the present invention.

FIG. 7 is a schematic structural diagram of a frequency offset detection apparatus 700 according to Embodiment 7 of the present invention. Referring to FIG. 7, on the basis of Embodiment 5, the frequency offset calibration module 510 specifically includes the following units: a second internal calibration value calculation unit 710 and a second internal calibration unit 720.

The second internal calibration value calculation unit 710 is configured to calculate an internal calibration value INNER_CAL according to n fifth count values $N_{5k}$ on n fifth counters and a third reference value $N_0$, where $N_{5k}$ denotes a count value obtained by the $k^{th}$ fifth counter by counting rising edges of the clock signal output by the local crystal oscillator, $N_0$ denotes a count value obtained, when the $k^{th}$ reference clock signal has no frequency offset and the clock signal output by the local crystal oscillator has no frequency offset, by the $k^{th}$ fifth counter by counting the rising edges of the clock signal output by the local crystal oscillator, and $$N_0 = \frac{A' \times f_0'}{f_k},$$

where A' is a second preset count value, A' is determined according to required precision of calibration performed on the frequency offset of the clock signal output by the local crystal oscillator, $f_0'$ denotes a frequency existing when the clock signal output by the local crystal oscillator has no frequency offset, and $f_k$ denotes a frequency existing when the $k^{th}$ reference clock signal has no frequency offset; and n reference clock signals are clock signals extracted from received service signals by the local crystal oscillator, n is an integer greater than 2, and k is an integer greater than or equal to 1 and less than or equal to n. The second internal calibration unit 720 is configured to perform, according to INNER_CAL, internal calibration on the frequency offset of the clock signal output by the local crystal oscillator.

Further, the second internal calibration value calculation unit 710 is specifically configured to: reset count values on n sixth counters and count values on the n fifth counters, and start the n fifth counters and the n sixth counters simultaneously, where the n sixth counters separately count rising edges of the n reference clock signals; determine whether a sixth count value $N_{6k}$ on the $k^{th}$ sixth counter is greater than or equal to A', where $N_{6k}$ denotes a count value obtained by the $k^{th}$ sixth counter by counting rising edges of the $k^{th}$ reference clock signal; if the sixth count value $N_{6k}$ on the $k^{th}$ sixth counter is greater than or equal to A', stop the counting of the $k^{th}$ sixth counter, reset the $k^{th}$ sixth counter, and send a stop signal to the $k^{th}$ fifth counter, so that the $k^{th}$ fifth counter stops counting and reads $N_{5k}$; calculate $$\Delta k = \frac{N_0 - N_{5k}}{N_0}$$

according to $N_{5k}$ and $N_0$; and calculate the internal calibration value INNER_CAL according to $$\sum_{k=1}^{n} \Delta k + n \times \Delta f' = 0,$$

where $$\text{INNER\_CAL} = -\frac{1}{n-2}\left(\sum_{k=1}^{n} \Delta k - \Delta m - \Delta n\right),$$

where $\Delta k$ denotes a frequency offset of the $i^{th}$ reference clock signal relative to the clock signal output by the local crystal oscillator, $\Delta f'$ denotes a frequency offset of the clock signal output by the local crystal oscillator, and $\Delta m$ and $\Delta n$ respectively denote a maximum value and a minimum value among n values calculated according to the formula $$\Delta k = \frac{N_0 - N_{5k}}{N_0}.$$

Further, the frequency offset detection module 520 is specifically configured to: calculate a frequency offset $\Delta f_k$ of the $k^{th}$ reference clock signal, where $\Delta f_k = \Delta k + \text{INNER\_CAL}$; determine whether a formula $-4.6 \text{ ppm} \leq \Delta f_k \leq 4.6 \text{ ppm}$ is true; if the formula $-4.6 \text{ ppm} \leq \Delta f_k \leq 4.6 \text{ ppm}$ is true, determine that the frequency offset of the $k^{th}$ reference clock signal meets required precision; and select, from p reference clock signals whose frequency offsets meet the required precision, a reference clock signal with a minimum absolute value of a frequency offset as a system clock signal of the network element device, where p is an integer greater than or equal to 1 and less than or equal to n, and ppm is parts per million.

According to the frequency offset detection apparatus provided by this embodiment, frequency offset detection is performed on a tracked reference clock signal by using a clock signal, output by a local crystal oscillator, on which internal calibration is performed, thereby improving precision of frequency offset detection performed on the reference clock signal by using the clock signal output by the local crystal oscillator, and ensuring that the tracked reference clock signal meets requirements of ITU-T G.813.

Persons of ordinary skill in the art may understand that all or some of the steps of the method embodiments may be implemented by a program instructing related hardware. The program may be stored in a computer-readable storage medium. When the program runs, the steps of the method embodiments are performed. The foregoing storage medium includes: any medium that can store program code, such as a ROM, a RAM, a magnetic disc, or an optical disc.

Finally, it should be noted that the foregoing embodiments are merely intended for describing the technical solutions of the present invention, but not for limiting the present invention. Although the present invention is described in detail with reference to the foregoing embodiments, persons of ordinary skill in the art should understand that they may still make modifications to the technical solutions described in the foregoing embodiments or make equivalent replacements to some or all technical features thereof, as long as these modifications or replacements do not cause the essence of the corresponding technical solutions to depart from the scope of the technical solutions of the embodiments of the present invention.

What is claimed is:

1. A frequency offset detection method comprising:
   calibrating a frequency offset of a clock signal output by a local crystal oscillator of a network element device; and
   performing frequency offset detection on a tracked reference clock signal by using the calibrated clock signal output by the local crystal oscillator,
   wherein the calibrating the frequency offset of the clock signal output by the local crystal oscillator of the network element device comprises:
   calculating an external calibration value EXT_CAL according to a first count value X on a first counter and a first reference value $X_0$, wherein X denotes a count value obtained, when a reference clock signal input to the local crystal oscillator through an external clock interface has no frequency offset, by the first counter by counting rising edges of the clock signal output by the local crystal oscillator, $X_0$ denotes a count value obtained, when the clock signal output by the local crystal oscillator has no frequency offset and the reference clock signal input to the local crystal oscillator through the external clock interface has no frequency offset, by the first counter by counting the rising edges of the clock signal output by the local crystal oscillator, and $$X_0 = \frac{A \times f_0}{f},$$

wherein A is a first preset count value, A is determined according to required precision of calibration performed on the frequency offset of the clock signal output by the local crystal oscillator, $f_0$ denotes a frequency existing when the clock signal output by the local crystal oscillator has no frequency offset, and f denotes a frequency existing when the reference clock signal input to the local crystal oscillator through the external clock interface has no frequency offset; and performing, according to EXT_CAL external calibration on the frequency offset of the clock signal output by the local crystal oscillator.

2. The method according to claim 1, wherein the calculating the external calibration value EXT_CAL according to the first count value X on the first counter and the first reference value $X_0$ comprises:

resetting a second counter and the first counter, and starting the first counter and the second counter simultaneously, wherein the second counter counts rising edges of the reference clock signal input to the local crystal oscillator through the external clock interface;

determining whether a second count value on the second counter is greater than or equal to A;

when the second count value on the second counter is greater than or equal to A, stopping the counting of the second counter, resetting the second counter, and sending a stop signal to the first counter, so that the first counter stops counting and reads X; and calculating EXT_CAL according to X and $X_0$, wherein $$\text{EXT\_CAL} = \frac{X - X_0}{X_0} + \Delta f,$$

wherein $\Delta f$ denotes a frequency offset of the reference clock signal input to the local crystal oscillator through the external clock interface.

3. The method according to claim 1, wherein after the performing, according to EXT_CAL, external calibration on the frequency offset of the clock signal output by the local crystal oscillator, the method further comprises:

calculating an internal calibration value INNER_CAL1 according to m third count values $M_{3i}$ on m third counters and a second reference value $M_0$, wherein $M_{3i}$ denotes a count value obtained by the $i^{th}$ third counter by counting rising edges of the clock signal, output by the local crystal oscillator, on which external calibration has been performed, $M_0$ denotes a count value obtained, when the $i^{th}$ reference clock signal has no frequency offset, by the $i^{th}$ third counter by counting the rising edges of the clock signal, output by the local crystal oscillator, on which external calibration has been performed, $M_0 = X_0 \times (1 + \text{EXT\_CAL})$, m reference clock signals are clock signals extracted from received service signals by the local crystal oscillator, m is an integer greater than 2, and i is an integer greater than or equal to 1 and less than or equal to m; and performing, according to INNER_CAL1, internal calibration on the frequency offset of the clock signal, output by the local crystal oscillator, on which external calibration has been performed.

4. The method according to claim 3, wherein the calculating the internal calibration value INNER_CAL1 according to m third count values $M_{3i}$ on m third counters and the second reference value $M_0$ comprises:

resetting m fourth counters and the m third counters, and starting the m third counters and the m fourth counters simultaneously, wherein the m fourth counters separately count rising edges of m reference clock signals, and the m reference clock signals are clock signals extracted from received service signals by the local crystal oscillator;

determining whether a fourth count value $M_{4i}$ on the $i^{th}$ fourth counter is greater than or equal to A, wherein $M_{4i}$ denotes a count value obtained by the $i^{th}$ fourth counter by counting rising edges of the $i^{th}$ reference clock signal;

when the fourth count value $M_{4i}$ on the $i^{th}$ fourth counter is greater than or equal to A, stopping the counting of the $i^{th}$ fourth counter, resetting the $i^{th}$ fourth counter, and sending a stop signal to the $i^{th}$ third counter, so that the $i^{th}$ third counter stops counting and reads $M_{3i}$;

calculating $$\Delta i = \frac{M_0 - M_{3i}}{M_0}$$

according to $M_{3i}$ and $M_0$; and calculating the internal calibration value INNER_CAL1 according to $$\sum_{i=1}^{m} \Delta i + m \times \Delta f' = 0,$$

wherein $$\text{INNER\_CAL1} = -\frac{1}{m-2}\left(\sum_{i=1}^{m} \Delta i - \Delta x - \Delta y\right),$$

wherein $\Delta i$ denotes a frequency offset of the $i^{th}$ reference clock signal relative to the clock signal, output by the local crystal oscillator, on which external calibration has been performed, $\Delta f'$ denotes the frequency offset of the clock signal, output by the local crystal oscillator, on which external calibration has been performed, and $\Delta x$ and $\Delta y$ and respectively denote a maximum value and a minimum value among m values calculated according to the formula $$\Delta i = \frac{M_0 - M_{3i}}{M_0}.$$

5. The method according to claim 4, wherein the performing frequency offset detection on the tracked reference clock signal by using the calibrated clock signal output by the local crystal oscillator comprises:

calculating a frequency offset $\Delta f_i$ of the $i^{th}$ reference clock signal, wherein $\Delta f_i = \Delta i + \text{EXT\_CAL} + \text{INNER\_CAL1}$;

determining whether a formula $-4.6 \text{ ppm} \leq \Delta f_i \leq 4.6 \text{ ppm}$ is true;

when the formula $-4.6 \text{ ppm} \leq \Delta f_i \leq 4.6 \text{ ppm}$ is true, determining that the frequency offset of the $i^{th}$ reference clock signal meets required precision; and selecting, from j reference clock signals whose frequency offsets meet the required precision, a reference clock signal with a minimum absolute value of a frequency offset as a system clock signal of the network element device, wherein j is an integer greater than or equal to 1 and less than or equal to m, wherein ppm is parts per million.

6. A frequency offset detection method comprising:

calibrating a frequency offset of a clock signal output by a local crystal oscillator of a network element device; and performing frequency offset detection on a tracked reference clock signal by using the calibrated clock signal output by the local crystal oscillator, wherein the calibrating the frequency offset of the clock signal output by the local crystal oscillator of the network element device comprises:

calculating an internal calibration value INNER_CAL according to n fifth count values $N_{5k}$ on n fifth counters and a third reference value $N_0$, wherein $N_{5k}$ denotes a count value obtained by the $k^{th}$ fifth counter by counting rising edges of the clock signal output by the local crystal oscillator, $N_0$ denotes a count value obtained, when the $k^{th}$ reference clock signal has no frequency offset and the clock signal output by the local crystal oscillator has no frequency offset, by the $k^{th}$ fifth counter by counting the rising edges of the clock signal output by the local crystal oscillator, and $$N_0 = \frac{A' \times f_0'}{f_k},$$

wherein A' is a second preset count value, A' is determined according to required precision of calibration performed on the frequency offset of the clock signal output by the local crystal oscillator, $f_0'$ denotes a frequency existing when the clock signal output by the local crystal oscillator has no frequency offset, and $f_k$ denotes a frequency existing when the $k^{th}$ reference clock signal has no frequency offset; and n reference clock signals are clock signals extracted from received service signals by the local crystal oscillator, n is an integer greater than 2, and k is an integer greater than or equal to 1 and less than or equal to n; and performing, according to INNER_CAL, internal calibration on the frequency offset of the clock signal output by the local crystal oscillator.

7. The method according to claim 6, wherein the calculating the internal calibration value INNER_CAL according to n fifth count values $N_{5k}$ on n fifth counters and the third reference value $N_0$ comprises:

resetting count values on n sixth counters and count values on the n fifth counters, and starting the n fifth counters and the n sixth counters simultaneously, wherein the n sixth counters separately count rising edges of the n reference clock signals;

determining whether a sixth count value $N_{6k}$ on the $k^{th}$ sixth counter is greater than or equal to A', wherein $N_{6k}$ denotes a count value obtained by the $k^{th}$ sixth counter by counting rising edges of the $k^{th}$ reference clock signal;

when the sixth count value $N_{6k}$ on the $k^{th}$ sixth counter is greater than or equal to A', stopping the counting of the $k^{th}$ sixth counter, resetting the $k^{th}$ sixth counter, and sending a stop signal to the $k^{th}$ fifth counter, so that the $k^{th}$ fifth counter stops counting and reads $N_{5k}$;

calculating $$\Delta k = \frac{N_0 - N_{5k}}{N_0}$$

according to $N_{5k}$ and $N_0$; and calculating the internal calibration value INNER_CAL according to $$\sum_{k=1}^{n} \Delta k + n \times \Delta f' = 0,$$

wherein $$\text{INNER\_CAL} = -\frac{1}{n-2}\left(\sum_{k=1}^{n} \Delta k - \Delta m - \Delta n\right),$$

wherein $\Delta k$ denotes a frequency offset of the $k^{th}$ reference clock signal relative to the clock signal output by the local crystal oscillator, $\Delta f'$ denotes a frequency offset of the clock signal output by the local crystal oscillator, and $\Delta m$ and $\Delta n$ respectively denote a maximum value and a minimum value among n values calculated according to the formula $$\Delta k = \frac{N_0 - N_{5k}}{N_0}.$$

8. The method according to claim 7, wherein the performing frequency offset detection on the tracked reference clock signal by using the calibrated clock signal output by the local crystal oscillator comprises:

calculating a frequency offset $\Delta f_k$ of the $k^{th}$ reference clock signal, wherein $\Delta f_k = \Delta k + \text{INNER\_CAL}$;

determining whether a formula $-4.6$ ppm$\leq \Delta f_k \leq 4.6$ ppm is true;

when the formula $-4.6$ ppm$\leq \Delta f_k \leq 4.6$ ppm is true, determining that the frequency offset of the $k^{th}$ reference clock signal meets required precision; and selecting, from p reference clock signals whose frequency offsets meet the required precision, a reference clock signal with a minimum absolute value of a frequency offset as a system clock signal of the network element device, wherein p is an integer greater than or equal to 1 and less than or equal to n, wherein ppm is parts per million.

9. A frequency offset detection apparatus comprising:

a processor; and a non-transitory computer readable medium having a plurality of processor-executable instructions that, when executed by the processor, cause the processor to perform operations comprising:

calibrating a frequency offset of a clock signal output by a local crystal oscillator of a network element device; and performing frequency offset detection on a tracked reference clock signal by using the calibrated clock signal output by the local crystal oscillator, wherein the processor is configured with processor-executable instructions to perform operations such that calibrating the frequency offset of the clock signal output by the local crystal oscillator of the network element device comprises:

calculating an external calibration value EXT_CAL according to a first count value X on a first counter and a first reference value $X_0$, wherein X denotes a count value obtained, when a reference clock signal input to the local crystal oscillator through an external clock interface has no frequency offset, by the first counter by counting rising edges of the clock signal output by the local crystal oscillator, $X_0$ denotes a count value obtained, when the clock signal output by the local crystal oscillator has no frequency offset and the reference clock signal input to the local crystal oscillator through the external clock interface has no frequency offset, by the first counter by counting the rising edges of the clock signal output by the local crystal oscillator, and $$X_0 = \frac{A \times f_0}{f},$$

wherein A is a first preset count value, A is determined according to required precision of calibration performed on the frequency offset of the clock signal output by the local crystal oscillator, $f_0$ denotes a frequency existing when the clock signal output by the local crystal oscillator has no frequency offset, and f denotes a frequency existing when the reference clock signal input to the local crystal oscillator through the external clock interface has no frequency offset; and performing, according to EXT_CAL, external calibration on the frequency offset of the clock signal output by the local crystal oscillator.

10. The apparatus according to claim 9, wherein the processor is configured to execute processor-executable instructions to perform operations such that calculating the external calibration value EXT_CAL according to the first count value X on the first counter and the first reference value $X_0$ comprises:

resetting a second counter and the first counter, and starting the first counter and the second counter simultaneously, wherein the second counter counts rising edges of the reference clock signal input to the local crystal oscillator through the external clock interface; determining whether a second count value on the second counter is greater than or equal to A; when the second count value on the second counter is greater than or equal to A, stopping the counting of the second counter, resetting the second counter, and sending a stop signal to the first counter, so that the first counter stops counting and reads X; and calculating EXT_CAL according to X and $X_0$, wherein $$\text{EXT\_CAL} = \frac{X - X_0}{X_0} + \Delta f,$$

wherein $\Delta f$ denotes a frequency offset of the reference clock signal input to the local crystal oscillator through the external clock interface.

11. The apparatus according to claim 9, after the operation of external calibration is performed, the processor is configured to execute processor-executable instructions to perform operations further comprising:

according to EXT_CAL, on the frequency offset of the clock signal output by the local crystal oscillator, calculating an internal calibration value INNER_CAL1 according to m third count values $M_{3i}$ on m third counters and a second reference value $M_0$, wherein $M_{3i}$ denotes a count value obtained by the $i^{th}$ third counter by counting rising edges of the clock signal, output by the local crystal oscillator, on which external calibration has been performed, $M_0$ denotes a count value obtained, when the $i^{th}$ reference clock signal has no frequency offset, by the $i^{th}$ third counter by counting the rising edges of the clock signal, output by the local crystal oscillator, on which external calibration has been performed, $M_0 = X_0 \times (1 + \text{EXT\_CAL})$, m reference clock signals are clock signals extracted from received service signals by the local crystal oscillator, m is an integer greater than 2, and i is an integer greater than or equal to 1 and less than or equal to m; and performing, according to INNER_CAL1, internal calibration on a frequency offset of the clock signal, output by the local crystal oscillator, on which external calibration has been performed.

12. The apparatus according to claim 11, wherein the processor is configured to execute processor-executable instructions to perform operations such that calculating the internal calibration value INNER_CAL1 according to m third count values $M_{3i}$ on m third counters and the second reference value $M_0$ comprises:

resetting m fourth counters and the m third counters, and starting the m third counters and the m fourth counters simultaneously, wherein the m fourth counters separately count rising edges of m reference clock signals, and the m reference clock signals are clock signals extracted from received service signals by the local crystal oscillator; determining whether a fourth count value $M_{4i}$ on the $i^{th}$ fourth counter is greater than or equal to A, wherein $M_{4i}$ denotes a count value obtained by the $i^{th}$ fourth counter by counting rising edges of the $i^{th}$ reference clock signal; when the fourth count value $M_{4i}$ on the $i^{th}$ fourth counter is greater than or equal to A, stopping the counting of the $i^{th}$ fourth counter, resetting the $i^{th}$ fourth counter, and sending a stop signal to the $i^{th}$ third counter, so that the $i^{th}$ third counter stops counting and reads $M_{3i}$; calculating $$\Delta i = \frac{M_0 - M_{3i}}{M_0}$$

according to $M_{3i}$ and $M_0$; and calculating the internal calibration value INNER_CAL1 according to $$\sum_{i=1}^{m} \Delta i + m \times \Delta f' = 0,$$

wherein $$\text{INNER\_CAL1} = -\frac{1}{m-2}\left(\sum_{i=1}^{m} \Delta i - \Delta x - \Delta y\right),$$

wherein $\Delta i$ denotes a frequency offset of the $i^{th}$ reference clock signal relative to the clock signal, output by the local crystal oscillator, on which external calibration has been performed, Δf' denotes the frequency offset of the clock signal, output by the local crystal oscillator, on which external calibration has been performed, and Δx and Δy respectively denote a maximum value and a minimum value among m values calculated according to the formula $$\Delta i = \frac{M_0 - M_{3i}}{M_0}.$$

13. The apparatus according to claim 12, wherein the processor is configured to execute processor-executable instructions to perform operations such that performing frequency offset detection on the tracked reference clock signal by using the calibrated clock signal output by the local crystal oscillator comprises:
calculating a frequency offset $\Delta f_i$ of the $i^{th}$ reference clock signal, wherein $\Delta f_i = \Delta i + EXT\_CAL + INNER\_CAL1$; determining whether a formula $-4.6$ ppm$\leq \Delta f_i \leq 4.6$ ppm is true; when the formula $-4.6$ ppm$\leq \Delta f_k \leq 4.6$ ppm is true, determining that the frequency offset of the $i^{th}$ reference clock signal meets required precision; and selecting, from j reference clock signals whose frequency offsets meet the required precision, a reference clock signal with a minimum absolute value of a frequency offset as a system clock signal of the network element device, wherein j is an integer greater than or equal to 1 and less than or equal to m, and ppm is parts per million.

14. A frequency offset detection apparatus comprising:
a processor; and
a non-transitory computer readable medium having a plurality of processor-executable instructions that, when executed by the processor, cause the processor to perform operations comprising:
calibrating a frequency offset of a clock signal output by a local crystal oscillator of a network element device; and
performing frequency offset detection on a tracked reference clock signal by using the calibrated clock signal output by the local crystal oscillator,
wherein the processor is configured with processor-executable instructions to perform operations such that calibrating the frequency offset of the clock signal output by the local crystal oscillator of the network element device comprises:
calculating an internal calibration value INNER_CAL according to n fifth count values $N_{5k}$ on n fifth counters and a third reference value $N_0$, wherein $N_{5k}$ denotes a count value obtained by the $k^{th}$ fifth counter by counting rising edges of the clock signal output by the local crystal oscillator, $N_0$ denotes a count value obtained, when the $k^{th}$ reference clock signal has no frequency offset and the clock signal output by the local crystal oscillator has no frequency offset, by the $k^{th}$ fifth counter by counting the rising edges of the clock signal output by the local crystal oscillator, and $$N_0 = \frac{A' \times f_0'}{f_k},$$

wherein A' is a second preset count value, A' is determined according to required precision of calibration performed on the frequency offset of the clock signal output by the local crystal oscillator, $f_0'$ denotes a frequency existing when the clock signal output by the local crystal oscillator has no frequency offset, and $f_k$ denotes a frequency existing when the $k^{th}$ reference clock signal has no frequency offset; and n reference clock signals are clock signals extracted from received service signals by the local crystal oscillator, n is an integer greater than 2, and k is an integer greater than or equal to 1 and less than or equal to n; and
performing, according to INNER_CAL, internal calibration on the frequency offset of the clock signal output by the local crystal oscillator.

15. The apparatus according to claim 14, wherein the processor is configured to execute processor-executable instructions to perform operations such that calculating the internal calibration value INNER_CAL according to n fifth count values $N_{5k}$ on n fifth counters and the third reference value $N_0$ comprises:
resetting count values on n sixth counters and count values on the n fifth counters, and starting the n fifth counters and the n sixth counters simultaneously, wherein the n sixth counters separately count rising edges of the n reference clock signals; determining whether a sixth count value $N_{6k}$ on the $k^{th}$ sixth counter is greater than or equal to A', wherein $N_{6k}$ denotes a count value obtained by the $k^{th}$ sixth counter by counting rising edges of the $k^{th}$ reference clock signal; when the sixth count value $N_{6k}$ on the $k^{th}$ sixth counter is greater than or equal to A', stopping the counting of the $k^{th}$ sixth counter, resetting the $k^{th}$ sixth counter, and sending a stop signal to the $k^{th}$ fifth counter, so that the $k^{th}$ fifth counter stops counting and reads $N_{5k}$; calculating $$\Delta k = \frac{N_0 - N_{5k}}{N_0}$$

according to $N_{5k}$ and $N_0$; and calculating the internal calibration value INNER_CAL according to $$\sum_{k=1}^{n} \Delta k + n \times \Delta f' = 0,$$

wherein $$INNER\_CAL = -\frac{1}{n-2}\left(\sum_{k=1}^{n} \Delta k - \Delta m - \Delta n\right),$$

wherein Δk denotes a frequency offset of the $k^{th}$ reference clock signal relative to the clock signal output by the local crystal oscillator, Δf' denotes a frequency offset of the clock signal output by the local crystal oscillator, and Δm and Δn respectively denote a maximum value and a minimum value among n values calculated according to the formula $$\Delta k = \frac{N_0 - N_{5k}}{N_0}.$$

16. The apparatus according to claim 15, wherein the processor is configured to execute processor-executable instructions to perform operations such that performing frequency offset detection on the tracked reference clock signal by using the calibrated clock signal output by the local crystal oscillator comprises:

calculating a frequency offset $\Delta f_k$ of the $k^{th}$ reference clock signal, wherein $\Delta f_k = \Delta k + \text{INNER\_CAL}$; determining whether a formula $-4.6 \text{ ppm} \leq \Delta f_k \leq 4.6 \text{ ppm}$ is true; when the formula $-4.6 \text{ ppm} \leq \Delta f_k \leq 4.6 \text{ ppm}$ is true, determining that the frequency offset of the $k^{th}$ reference clock signal meets required precision; and selecting, from p reference clock signals whose frequency offsets meet the required precision, a reference clock signal with a minimum absolute value of a frequency offset as a system clock signal of the network element device, wherein p is an integer greater than or equal to 1 and less than or equal to n, and ppm is parts per million.

* * * * *